United States Patent [19]
Herklotz

[11] Patent Number: 5,422,451
[45] Date of Patent: Jun. 6, 1995

[54] ELECTRICAL CONTACT ELEMENT

[75] Inventor: Gunter Herklotz, Bruchkobel, Germany

[73] Assignee: W. C. Heraeus GmbH, Germany

[21] Appl. No.: 78,835

[22] Filed: Jun. 21, 1993

[30] Foreign Application Priority Data

Jul. 21, 1992 [DE] Germany .......... 42 24 012.3

[51] Int. Cl.⁶ .............................. H01H 1/02
[52] U.S. Cl. .................. 200/269; 200/270; 200/262
[58] Field of Search ........... 200/269, 270, 262, 265, 200/266; 317/500

[56] References Cited

U.S. PATENT DOCUMENTS

| | | | |
|---|---|---|---|
| 1,904,241 | 4/1933 | Kammern | 200/269 |
| 3,367,756 | 2/1968 | LaPlante | 29/199 |
| 3,576,415 | 4/1971 | Gwyn, Jr. | 200/269 |
| 3,703,656 | 11/1972 | Barnett et al. | 313/500 |
| 4,053,728 | 10/1977 | Talento et al. | 200/267 |
| 4,088,803 | 5/1978 | Kubo et al. | 200/268 |
| 4,339,644 | 7/1982 | Aldinger et al. | 200/266 |
| 5,139,890 | 8/1992 | Cowie et al. | 200/269 |

FOREIGN PATENT DOCUMENTS

| | | |
|---|---|---|
| 055368 | 6/1985 | European Pat. Off. . |
| 134532 | 4/1987 | European Pat. Off. . |
| 082271 | 9/1987 | European Pat. Off. . |
| 359228 | 3/1990 | European Pat. Off. . |

*Primary Examiner*—Henry J. Recla
*Assistant Examiner*—David J. Walczak
*Attorney, Agent, or Firm*—Finnegan, Henderson, Farabow, Garrett & Dunner

[57] ABSTRACT

An electrical contact element having a core part made of an iron/nickel alloy and a gold/tin alloy applied to a portion of the core part which serves as a solderable connection part. The gold/tin alloy has a tin content of from about 10 to about 40% by weight and an adhesive layer, formed of a silver/tin alloy and containing about 10 to 50% by weight tin, is located between the core part and the gold/tin alloy.

4 Claims, 1 Drawing Sheet

ELECTRICAL CONTACT ELEMENT

BACKGROUND OF THE INVENTION

This invention relates to an electrical contact element having a core part made of an iron/nickel alloy with a gold/tin alloy applied to a portion of the core part serving as a solderable connection therefor.

Contact elements of this type are soldered, by means of the gold/tin alloy, onto a support, for example a ceramic substrate, and serve to establish electrical contacts with further electrotechnical or electronic components. The gold/tin alloy serving as the solderable connection should, in this case, cover only that portion of the core part which is to be soldered directly to the support. As the core part conventionally comprises base metals or alloys thereof, the problem is that of finding a suitable adhesive layer which, when used between the core part and the gold/tin alloy, not only ensures the necessary electrical properties such as conductivity, contact resistance etc., but also ensures that the gold/tin alloy remains on the portion of the core part intended therefor and does not accidentally wet further regions of the surface of the core part.

The material used for such an adhesive layer is usually gold. Such a gold layer has the required properties and at the same time avoids the wetting of an unintentionally large portion of the surface of the core part with the gold/tin alloy, so that the size of the wetted area can be accurately controlled by means of the quantity of the gold/tin alloy applied to the core part. However, in those contact elements in which the solderable area, that is the area to be wetted with the gold/tin alloy, is relatively large in proportion to the total surface of the contact element, the use of an adhesive layer made of gold significantly increases the costs of the contact element.

It is therefore an object of the present invention to find a material for the adhesive layer which, while ensuring approximately identical electrical and physical/chemical properties, is cheaper than gold and at the same time, like gold, prevents the uncontrolled running of the gold/tin alloy on the surface of the contact element.

SUMMARY OF THE INVENTION

This object is achieved in accordance with the present invention by providing an electrical contact element comprising a core part made of an iron/nickel alloy, a solderable connection part made of a gold/tin alloy applied to a portion of the core part, the gold/tin alloy having a tin content of from about 10 to about 40% by weight, and an adhesive layer located between the core part and the solderable connection part formed of a silver/tin alloy having a tin content of from about 10 to about 50% by weight, with the remainder being of silver.

Such an adhesive layer is considerably less expensive than an adhesive layer made from gold and is equivalent to the gold layer with respect to its required electrical or physical/chemical properties.

It is preferable for the silver/tin alloy of the adhesive layer to have a tin content of from about 15 to about 40% by weight.

It is furthermore desirable for a nickel layer to be located between the core part and the adhesive layer. The nickel layer serves as a barrier for the diffusion of iron from the iron/nickel alloy of the core part into the adhesive layer. This is particularly advantageous in those cases in which the presence of the iron may effect the properties of the adhesive layer in an undesirable manner.

BRIEF DESCRIPTION OF THE DRAWINGS

The invention will be explained below in more detail with reference to the drawings in which.

DETAILED DESCRIPTION OF THE INVENTION

Figure 1:
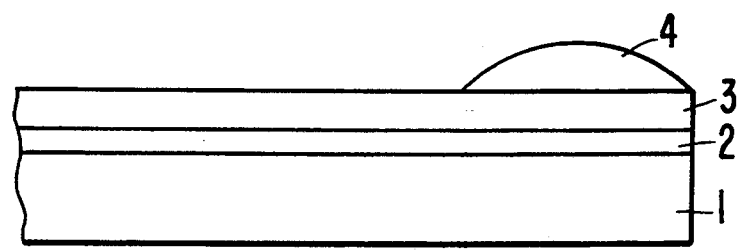
FIG. 1 is a side view of a contact spring with a gold/tin alloy.

The electrical contact element shown in FIG. 1 has a core part 1 in the form of a flat strip made of an iron/nickel alloy (e.g. Kovar). Core part 1 is provided with a nickel layer 2 as a diffusion barrier against diffusion of the iron from the core part. Disposed on top of nickel layer 2 is an adhesive layer 3.

In accordance with the invention, adhesive layer 3 comprises a silver/tin alloy, applied for example, by electroplating to the nickel layer, having a tin content of from about 10 to 50% by weight, preferably from 15 to 40% and more preferably about 20% by weight. The remainder of the alloy is of silver. Disposed on a portion of adhesive layer 3 is a solderable connection part 4 formed of a gold/tin alloy. The gold/tin alloy is typically placed as a sphere on the adhesive layer 3 and is then melted by means of a temperature treatment at approximately 305° C. lasting for several minutes.

Nickel layer 2 is optional, it being possible for adhesive layer 3 to be applied directly to core part 1. When nickel layer 2 is used, it should have a layer thickness of approximately 2 $\mu$m to prevent diffusion of iron from the core part into adhesive layer 3. Adhesive layer 3 should have a thickness of from approximately 2 to 4 $\mu$m, greater layer thicknesses also being possible, though of no benefit for most applications.

The adhesive layer can be applied on the core part by means of, for example, electroplating or PVD processes. The gold/tin alloy can be applied, for example, as molten drops or as a solid material, for instance in spherical form, and then bonded to the adhesive layer by subsequent melting. In the melting process, the gold/tin sphere deforms into a shape similar to a spherical segment as shown in FIG. 1. The size of the area wetted by the gold/tin alloy can be controlled, in this case, by means of the amount of gold/tin alloy applied. Even if the core part is coated with the adhesive layer over a large area, for instance on all sides, the adhesive layer being usable, at the same time, as a contact layer for spring contacts, sliding contacts or plug-in contacts, the gold/tin alloy only wets a narrowly constrained region of the adhesive layer.

Figure 2:
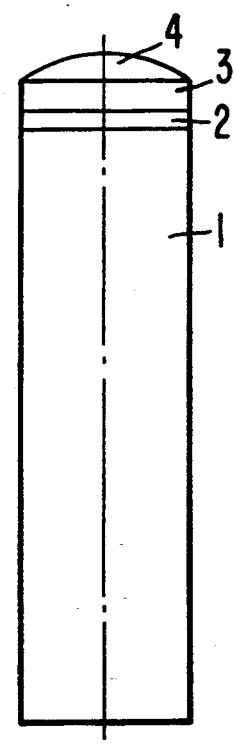
FIG. 2 shows a contact pin in longitudinal section.

A further embodiment of the invention is shown in FIG. 2. In this case, solderable connection part 4 is provided on the end face of a cylindrical core part 1. Disposed on the end face, in the same way as described above, is a nickel layer 2 and an adhesive layer 3. Onto this and covering the end face, is a gold/tin alloy in the form of a spherical segment 4 whose contact surface corresponds with the end face of core part 1.

What is claimed is:

1. In an electrical contact element having a core part made of an iron/nickel alloy and a solderable connection part made of a gold/tin alloy carried by a portion of the core part, said gold/tin alloy having a tin content of from about 10% to about 40% by weight, the improvement comprising an adhesive layer located next to the solderable connection part and between the core part and the solderable connection part, said adhesive layer being formed of a silver/tin alloy having a tin content of from about 10% to about 50% by weight, with the remainder being of silver.

2. The electrical contact element of claim 1, wherein the silver/tin alloy of the adhesive layer has a tin content of from about 15% to about 40% by weight.

3. The electrical contact element of claim 1, including a layer of nickel between the core part and the adhesive layer.

4. The electrical contact element of claim 2, including a layer of nickel between the core part and the adhesive layer.

* * * * *